US008872532B2

(12) United States Patent
Breinlinger et al.

(10) Patent No.: US 8,872,532 B2
(45) Date of Patent: Oct. 28, 2014

(54) WAFER TEST CASSETTE SYSTEM

(75) Inventors: Keith J. Breinlinger, San Ramon, CA (US); Eric D. Hobbs, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 624 days.

(21) Appl. No.: 12/979,200

(22) Filed: Dec. 27, 2010

(65) Prior Publication Data

US 2011/0156735 A1  Jun. 30, 2011

Related U.S. Application Data

(60) Provisional application No. 61/291,824, filed on Dec. 31, 2009.

(51) Int. Cl.
  *G01R 31/00* (2006.01)
  *G01R 1/04* (2006.01)
  *G01R 31/302* (2006.01)

(52) U.S. Cl.
  CPC .......... *G01R 1/0491* (2013.01); *G01R 31/3025* (2013.01)
  USPC .................................................. 324/750.19

(58) Field of Classification Search
  USPC ........................................ 324/750.16–750.25
  See application file for complete search history.

(56) References Cited

U.S. PATENT DOCUMENTS

| | | | | |
|---|---|---|---|---|
| 5,506,498 A | * | 4/1996 | Anderson et al. | 324/754.07 |
| 5,570,032 A | * | 10/1996 | Atkins et al. | 324/750.06 |
| 5,631,573 A | * | 5/1997 | Ohno | 324/754.07 |
| 5,644,245 A | * | 7/1997 | Saitoh et al. | 324/750.18 |
| 5,656,943 A | * | 8/1997 | Montoya et al. | 324/750.25 |
| 5,982,182 A | * | 11/1999 | Chiu et al. | 324/757.01 |
| 6,040,700 A | * | 3/2000 | Berar | 324/750.19 |
| 6,111,421 A | * | 8/2000 | Takahashi et al. | 324/750.04 |
| 6,166,552 A | * | 12/2000 | O'Connell | 324/750.24 |
| 6,297,658 B1 | * | 10/2001 | Nakata et al. | 324/750.05 |
| 6,377,062 B1 | | 4/2002 | Ramos et al. | |
| 6,413,113 B2 | * | 7/2002 | Uher et al. | 439/372 |
| 6,627,483 B2 | | 9/2003 | Ondricek et al. | |
| 6,756,800 B2 | * | 6/2004 | Chiu et al. | 324/750.19 |
| 6,874,638 B2 | * | 4/2005 | Iijima et al. | 206/711 |
| 7,202,687 B2 | | 4/2007 | Khandros et al. | |
| 7,358,754 B2 | * | 4/2008 | Sinsheimer et al. | 324/750.22 |

(Continued)

FOREIGN PATENT DOCUMENTS

| | | |
|---|---|---|
| JP | 11-121555 | 4/1999 |
| JP | 11-238770 | 8/1999 |

(Continued)

OTHER PUBLICATIONS

Int'l Search Report, PCT/US2010/062260 (Sep. 14, 2011), 3 pages.

(Continued)

*Primary Examiner* — Patrick Assouad
*Assistant Examiner* — Demetrius Pretlow
(74) *Attorney, Agent, or Firm* — Kirton McConkie

(57) ABSTRACT

Wafer cassette systems and methods of using wafer cassette systems. A wafer cassette system can include a base and a probe card assembly. The base and the probe card assembly can each include complementary interlocking alignment elements. The alignment elements can constrain relative movement of the base and probe card assembly in directions parallel to a wafer receiving surface of the base, while permitting relative movement in a direction perpendicular to the receiving surface.

10 Claims, 6 Drawing Sheets

(56) References Cited

U.S. PATENT DOCUMENTS

| | | | |
|---|---|---|---|
| 7,538,564 B2* | 5/2009 | Ehrmann et al. | 324/754.23 |
| 7,956,627 B2* | 6/2011 | Kasukabe et al. | 324/750.22 |
| 2004/0130312 A1* | 7/2004 | Cooper et al. | 324/140 R |
| 2004/0227532 A1* | 11/2004 | Orsillo | 324/754 |
| 2005/0275418 A1* | 12/2005 | Chong et al. | 324/758 |
| 2005/0280431 A1* | 12/2005 | Amemiya et al. | 324/758 |
| 2005/0285614 A1* | 12/2005 | Ma | 324/765 |
| 2006/0261836 A1* | 11/2006 | Attalla et al. | 324/765 |
| 2007/0063721 A1* | 3/2007 | Dozier et al. | 324/754 |
| 2007/0096763 A1* | 5/2007 | Ehrmann et al. | 324/765 |
| 2007/0126441 A1* | 6/2007 | Mochizuki et al. | 324/754 |
| 2007/0159194 A1 | 7/2007 | Hasegawa et al. | |
| 2007/0170941 A1* | 7/2007 | Cooper et al. | 324/754 |
| 2007/0279074 A1* | 12/2007 | Kasukabe et al. | 324/754 |
| 2007/0285115 A1* | 12/2007 | Wood et al. | 324/758 |
| 2008/0079449 A1* | 4/2008 | Hobbs | 324/754 |
| 2008/0265922 A1* | 10/2008 | Eldridge et al. | 324/754 |
| 2008/0297185 A1* | 12/2008 | Kang et al. | 324/754 |
| 2010/0134128 A1 | 6/2010 | Hobbs | |
| 2010/0231249 A1* | 9/2010 | Dang et al. | 324/758 |

FOREIGN PATENT DOCUMENTS

| | | |
|---|---|---|
| JP | 2001-203244 | 7/2001 |
| JP | 2003-504890 | 2/2003 |
| JP | 2005-049254 | 2/2005 |
| WO | WO 2006-009061 | 1/2006 |

OTHER PUBLICATIONS

Written Opinion of the Int'l Searching Authority, PCT/US2010/062260 (Sep. 14, 2011), 5 pages.

* cited by examiner

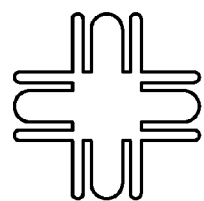
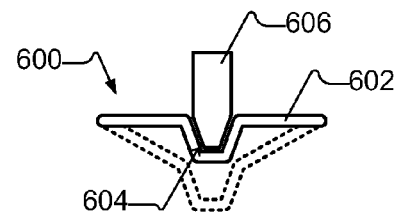
Figure 9
Figure 10
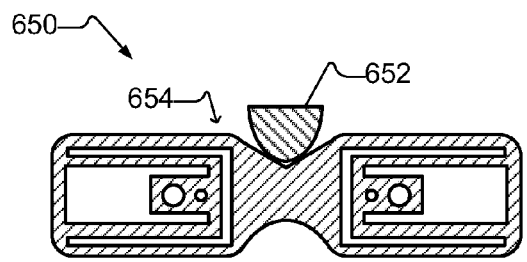
Figure 11A
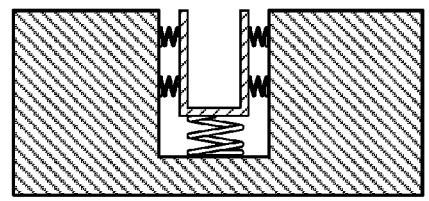
Figure 12
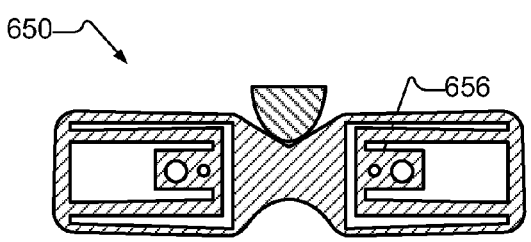
Figure 11B

WAFER TEST CASSETTE SYSTEM

The present application claims the benefit of U.S. Provisional Patent Application Ser. No. 61/291,824, entitled "Wafer Test Cassette System," filed on Dec. 31, 2009, which is herein incorporated by reference.

CROSS-REFERENCE TO RELATED APPLICATION(S)

The present application is related to U.S. patent application Ser. No. 12/327,576 entitled "Thermocentric Alignment of Elements on Parts of an Apparatus" filed on Dec. 3, 2008.

BACKGROUND

Microelectronic devices (e.g. dies) are typically manufactured in large number on a semiconductor wafer. For various reasons, microelectronic devices may fail to perform correctly. Accordingly, as a part of the manufacturing process, various tests of the microelectronic devices are typically performed. Tests can include, for example, functional tests, speed tests and sorting, and burn-in testing. Testing is often performed at the wafer level (e.g., before the microelectronic devices are separated from each other in a process called singulation) to allow failed to devices to be identified before packaging the devices.

To perform tests on the wafer, temporary electrical connections to the microelectronic devices on the wafer are made. For example, the wafer can be placed into a prober, and the wafer brought into contact with a probe card assembly. The probe card assembly can include many probes that are arranged to make temporary pressure-based electrical contacts to corresponding terminals (e.g., aluminum bond pads) on the microelectronic devices. Alignment of the wafer and probe card assembly can be performed using optical systems. Testing can involve sending signals to and from the wafer through the probes.

Many factors make it challenging to ensure proper alignment between the probe card assembly and the wafer. For example, when the probe card assembly is installed in the prober, various alignment operations (e.g., tilt adjust) are performed to place the tips of the probes into parallel alignment with the surface of a stage on which the wafer will rest. When a probe card assembly is removed and reinstalled in a prober, it is typically necessary to go through the alignment process again.

Providing proper alignment is further complicated when temperature variations are present, as most materials change dimension as a function of temperature. A probe card assembly typically has a relatively large thermal mass (compared to the wafer), and thus it takes considerable time to change the temperature of the probe card assembly (e.g., when performing burn-in testing at elevated temperatures). During the time periods when the probe card assembly is being aligned, cooling down, or heating up, the prober is not being used to perform tests.

BRIEF DESCRIPTION OF THE DRAWINGS

FIGS. 5-9 illustrates various alternate arrangements of thermocentric slots than can be used as alignment elements according to some embodiments of the invention.

FIG. 10 illustrates an example of a flexure that can be used as an alignment element according to some embodiments of the invention.

FIGS. 11A, 11B and 12 illustrate various alternate arrangements of flexures that can be used as alignment elements according to some embodiments of the invention.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on or attached to or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In some figures, "x," "y," and "z" axes are provided in accordance with a right-hand coordinate system for ease of discussion and illustration but not by way of limitation. With reference to particular directions or orientations, the term "substantially" may be used, by which it is to be understood that the recited direction or orientation need not be exact, but may include deviations or variations, including for example, tolerances, measurement error, measurement accuracy limitations, conversion factors, rounding off, and other factors known to skill in the art. In addition, where reference is made to a list of elements (e.g., elements a, b, c), such reference is intended to include any one of the listed elements by itself, any combination of less than all of the listed elements, and/or a combination of all of the listed elements. In addition, where reference is made to a range of values, such reference is intended not only the explicitly recited range, but also all the individual values and sub-ranges encompassed within that range.

Figure 1:
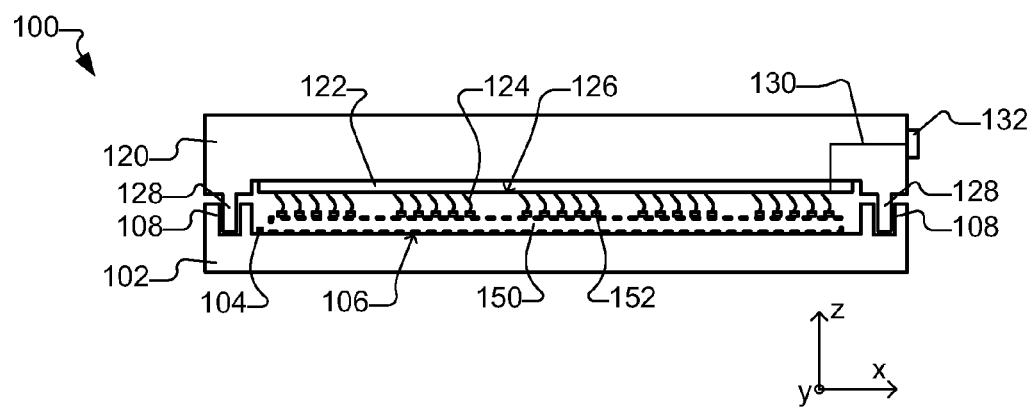
FIG. 1 illustrates a side view of a wafer cassette test system according to some embodiments of the invention.

FIG. 1 illustrates a schematic side view depiction of a wafer test cassette system, shown generally at 100, which can address some of the challenges introduced above. The cassette system can include a base 102 and a probe card assembly 120. The base 102 can receive a wafer 150, and can include various features for holding and positioning the wafer. For example, the base can include a receiving surface 106 which is sized to receive the wafer 150. Included on the base can be one or more fiducials 104 and first alignment elements 108. The fiducials 104 can be used, for example, to help in aligning the wafer 150 on the base 102. For example, the fiducials 104 can be used to position the wafer in a predefined position on the base 102 relative to the first alignment elements 108. The fiducials can be, for example, optically viewable marks formed on the base (e.g., through printing, etching, embossing, and the like).

The wafer 150 can be a semiconductor wafer comprising one or more unsingulated semiconductor dies. Alternately, the wafer can be a plurality of electronic devices (e.g., singulated dies) which are held in a carrier or other holding device. Indeed, wafer 150 can be any electronic device or devices to be tested.

The probe card assembly 120 can include a substrate 122 having a surface 126 on which a plurality of probes 124 are disposed. For example, the probes 124 can be disposed on electrically conductive terminals (not shown) of a rigid substrate and electrically connected to electrically conductive traces (not shown) disposed on or in the substrate. The probe assembly 120 can include electrical connections 130 between the probes 124 and an electrical interface 132 (e.g., a connector) on the exterior of the cassette system 100. The probes 124 can be arranged in a pattern that corresponds to terminals 152 of the wafer 150. When the base 102 and probe card assembly 120 are brought together, the probes 124 can make temporary pressure electrical contacts to the terminals 152 allowing electrical signals to be transmitted between the probes 124 and the terminals 152. A latching mechanism (e.g., as described below) can be included to allow for attaching the base 102 and the probe card assembly 120 together. The probe card assembly 120 can be any contactor device with electrical connections to probes 124 for contacting wafer 150.

The probes 124 can be a resilient structure and can include a conductive material to allow an electronic signal to be transmitted through the probe. Non-limiting examples of probes 112 include composite structures formed of a core wire bonded to a conductive terminal (not shown) on the substrate 122 that is over coated with a resilient material as described in U.S. Pat. No. 5,476,211, U.S. Pat. No. 5,917,707, and U.S. Pat. No. 6,336,269. Probes 124 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes are disclosed in U.S. Pat. No. 6,827,584, U.S. Pat. No. 6,640,432, U.S. Pat. No. 6,441,315, and U.S. Patent Application Publication No. 2001/0012739. Other nonlimiting examples of probes 236 include conductive pogo pins, bumps, studs, stamped springs, needles, buckling beams, etc.

The probe card assembly can also include second alignment elements 128 which are arranged to correspond to the first alignment elements 108 of the base 102. The first alignment elements 108 and second alignment elements 128 can cooperate so that, when the base 102 and probe card assembly 120 are brought together, proper alignment of the probes 124 and the terminals 152 are provided. For example, the first alignment elements 108 and second alignment elements 128 can have complementary shapes that interlock together to constrain desired degrees of freedom of the base 102 relative to the probe card assembly 120.

For example, when bringing the probes 124 into contact with the terminals 152, it can be desirable to allow for a small amount of overtravel, where the probes 124 and terminals 152 are pressed together with a small amount of contact force to help break through non-conductive layers on the terminals 152, such as for example, oxides or hydrocarbon films. Thus, it can be desirable to allow for movement of the base 102 relative to the probe card assembly 120 in a vertical direction substantially perpendicular to the wafer 150 (and, therefore substantially perpendicular to the receiving surface 106). On the other hand, lateral movement of the probes 124 across the terminals 152 is generally undesirable as this can cause damage to the probes 124, terminals 152, or both. Accordingly, it can be undesirable to allow unconstrained movement of the base 102 relative to the probe card assembly 120 in horizontal directions substantially parallel to the wafer 150 (and receiving surface 106) once the probes have made contact with the terminals. More particularly, the alignment elements can cooperate to defined a predefined relative position of the base 102 and the probe card assembly 120 that is constrained in two degrees of translation (e.g., x and y direction) and three degrees of rotation while enabling translation in a third degree of translation (e.g., z direction, wherein the "x" axis runs horizontally on the page, the "z" axis runs vertically on the page, and the "y" axis, runs perpendicular to the x and z axes, i.e., into and out of, the page). When moving the base 102 and probe card assembly 120 together, the alignment elements can engage before the probes 124 and terminals 152 are close enough to make contact so that x and y movement and rotation is constrained over a range of z direction translation. As a specific non limiting example, the alignment elements can engage to preclude x and y movement over a z displacement range from +1,000 micrometers to −100 micrometers, where 0 is point at which the probes contact the terminals, and 0 to −100 micrometers represents the overtravel range.

A small amount of lateral movement of the tips of the probes 124 may be provided for, if desired, to produce a wiping action to help break through oxide layers. For example, probes 124 can be configured to produce a wiping action of the tip as they are vertically loaded. Alternatively, a small predefined amount of lateral movement of the probe card assembly 120 relative to the base 102 in a particular direction can be provided. Such movement can be provided by moving either one of the probe card assembly 120 and the base 102 relative to the other, while the other is held fixed. For example, the alignment elements can include asymmetries, stepped portions, slanted portions, or other structures that allow for lateral wiping movement. By way of example and not limitation, lateral movement of the probe tips of about 10 micrometers can be helpful in breaking through non-conductive layers. Accordingly, scrubbing motion of the probes 124 across terminals 152 of the wafer 150 can be generated, if desired.

It can also be desirable to accommodate differential dimensional changes of the base 102 and the probe card assembly 120. For example, thermal expansion differences can result in differential radial expansion between the base 102 and the probe card assembly 120. Accordingly, the cassette system 100 can accommodate such radial expansion while maintaining alignment of the base 102 and the probe card assembly 120 as described further below.

The cassette system 100 can provide more reliable alignment between the probes 124 and terminals 152 as compared to a conventional probing system. This is because a relatively small structural loop is provided, with alignment of the probes 124 to the terminals 152 being based on the alignment of the wafer 150 to the base 102 and the alignment of the base 102 to the probe card assembly 120. In contrast, in a conventional prober, the alignment of probes to the terminals relies on correct alignment in each of the following mechanical interfaces: wafer to chuck, chuck to stage actuators, stage actuators to frame, frame to head plate, head plate to probe card assembly, and probe card assembly to probe tips. Accordingly, many more sources for misalignment are present in the conventional prober as compared to the cassette system 100. Indeed, conventional probing systems typically require various calibration and alignment operations (e.g., tilt correction) to be performed on a regular basis to ensure that alignment is maintained.

Figure 2:
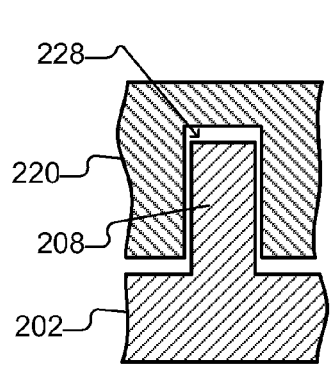
FIG. 2 illustrates a side cross section view of one detailed example of interlocking alignment elements according to some embodiments of the invention.

Embodiments of the cassette system 100 can use various other configurations of the first alignment elements 128 and second alignment elements 108 to provide the desired constraints of the base 102 and the probe card assembly 120. For example, FIG. 2 illustrates a side cross section view of one example of interlocking alignment elements that comprises a protrusion 208 and a receptacle 228. The protrusion 208 can be located on a base 202 (and thus can be a non-limiting example of a first alignment element 108 on base 102). The receptacle 228 can be located on a probe card assembly 220 (and thus can be a non-limiting example of a second alignment element 128 on probe card assembly 220). The protrusion and receptacle can have similar cross sectional shapes (e.g., circular, oval, square, rectangular, etc.). For example, the receptacle can be a hole and the protrusion can be post. Alternatively, the protrusion 208 can be located on the probe card assembly 220 and the receptacle 228 can be located on the base 202. The protrusion 208 and receptacle 228 can be fabricated with a desired degree of tolerance to ensure that the protrusion and receptacle provide a desired amount of alignment and constraint to the base 202 relative to the probe card assembly 220. Although not shown, if desired, the lips of the receptacle 228 and face of the protrusion 208 can be chamfered.

Figure 3:
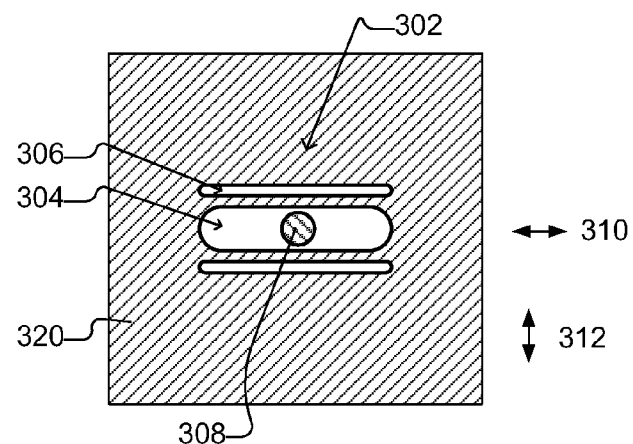
FIG. 3 illustrates a top view of another detailed example of an interlocking alignment element according to some embodiments of the invention.

In some embodiments, the receptacle 228 can be a thermocentric slot. For example, FIG. 3 illustrates a top view of an example of interlocking elements wherein the receptacle is a thermocentric slot 302 (and thus can be a non-limiting example of a first alignment element 108 or a second alignment element 128). The thermocentric slot 302 can include a center portion 304 which can accept a protrusion 308. The protrusion 308 is relatively unconstrained in a first direction 310, while relatively tightly constrained in a second direction 312. For example, if the protrusion 308 has a slightly larger cross section than the width of the center slot 302, the adjacent slots 306 provide an elastic force that tends to force the protrusion toward the center of the central slot 304, while allowing for movement in the first direction 310.

Accordingly, the cassette system 100 can, in some embodiments, use one or more thermocentric slots for the first alignment element 108 or the second alignment element 128. By using a number of thermocentric slots of various orientations, engagement of the base 102 and the probe card assembly 120 can be initiated and maintained even when thermal differences between the base 102 and probe card assembly 120 are present. For example, if a number of corresponding pairs of alignment elements (including a thermocentric slot) are provided, the position of the base 102 relative to the probe card assembly 120 can be over constrained. Thus, the alignment elements can tend to elastically average any positional errors. For example, by including three or more corresponding pairs of alignment elements, the position of the probe card assembly can be over constrained relative to the base in two directions.

Figure 4:
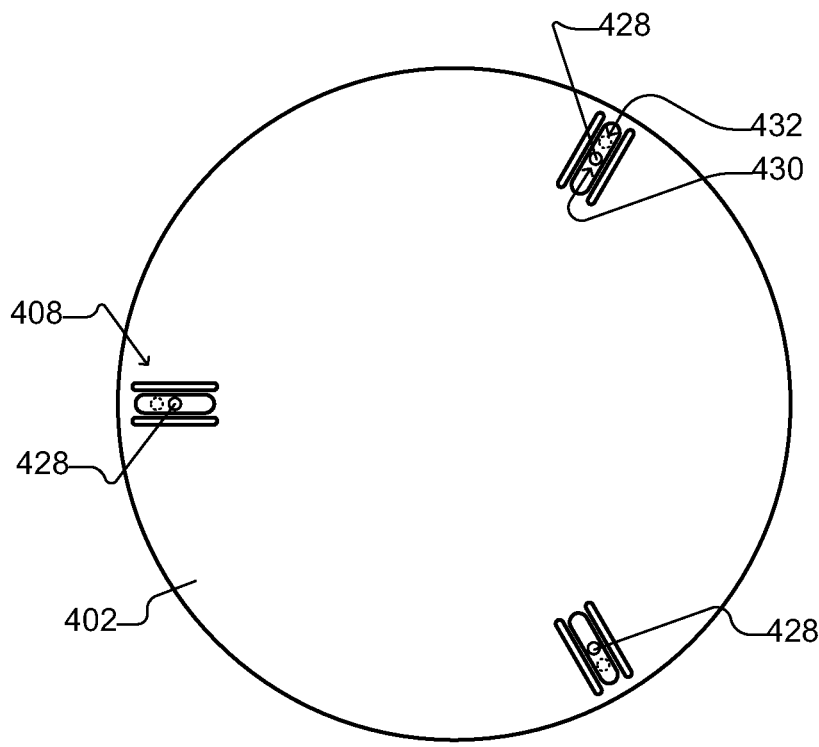
FIG. 4 illustrates a top view of another example of interlocking alignment elements according to some embodiments of the invention.
Figure 5:
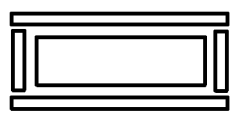
Figure 6:
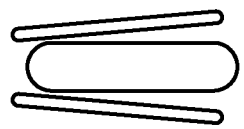
Figure 7:
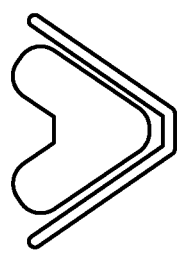
Figure 8:
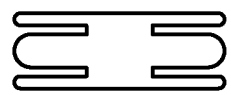

This can be particularly beneficial when temperature differences between the base 102 and probe card assembly 120 are present. For example, most materials tend to expand in size when heated. Thus, if the probe card assembly 120 is warmer than the base 102, the probe card assembly 120 may be slightly larger than the base 102, and the alignment elements may not perfectly align. Furthermore, such differential dimensional changes could result in bending of the base 102, the probe card assembly 120, or both if rigidly connected together. For example, FIG. 4 illustrates a top view of base 402 (which can be a non limiting example of base 102) having thermocentric slot receptacles 408. Protrusions 428 of a corresponding probe card assembly (not shown) can nominally align with the centers of the receptacles 408 in position 430 (shown in solid lines). When the probe card assembly is warmer than the base, however, the increase in dimension of the probe card assembly can result in the protrusions 428 being further apart, and thus moving toward the outer perimeter of the base in position 432 (shown in dotted lines). The thermocentric slot receptacles 408 can each provide an elastic force which pushes the protrusions toward the center of the slots. The probe card assembly can thus be urged in a position which remains centered relative to the base. This can help to provide accurate, repeatable positioning of the probe card assembly relative to the base, even when temperature differences are present. For example, repeatable positioning accuracy of the probe tips within about 2 micrometers may be feasible over a range of temperatures typically encountered in a testing system.

Various arrangements of a thermocentric slots can be used, as described in further detail in application Ser. No. 12/327, 576. FIGS. 5-9 illustrate additional arrangements of thermocentric slots that can be used as a first alignment element 108 or a second alignment element 128 in various embodiments of the invention.

Another example of receptacle that can be used as an alignment element (e.g., first alignment element 108 or second alignment element 128) is a flexure. FIG. 10 illustrates an example of flexure, which can be a non-limiting example of a first alignment element or a second alignment element. The flexure can be formed from an elastic material 602, and can include a depression or groove 604 which can receive a corresponding protrusion 606. In some embodiments the first alignment element 108 and the second alignment element 128 can have an interface that can be a kinematic coupling. For example, the first alignment element 108 can have a spherical portion that interfaces into a V-shaped groove portion of the second alignment element. Similarly the first alignment element 108 can include a V-shaped groove and the second alignment element 128 can include a spherical portion. As used herein, a kinematic coupling means a coupling which uses the minimum number of alignment feature pairs. For example, a 6 degree of freedom (DOF) kinematic coupling can be combined with a motion guidance mechanism such as a flexure or system of flexures to enable a prescribed relative motion between the base 120 and the probe card assembly 102. Another non-limiting example is a 6 DOF kinematic coupling placed in series with a single DOF flexure to enable the base 102 to be constrained in 5 DOFs (e.g., three rotational directions and x-y translation) and movable in a single DOF (e.g., z translation) relative to probe card assembly 120. The flexure can constrain horizontal movement, but can flex in a vertical direction. For example, the flexure is shown in deflected position using dotted lines. The flexure can be disposed on either a base or a probe card assembly (and the corresponding protrusion disposed on the other of the base and the probe card assembly).

FIGS. 11-12 illustrate additional arrangements of flexures that can be used as alignment elements in various embodiments of the invention. FIG. 11A shows an alternate arrangement of a flexure 650 used as a receptacle 654 which receives a rounded protrusion 652. The flexure is shown in a flexed position in FIG. 11B. The flexure can include integral structure 656 which functions as a stop, limiting flexing of the flexure once a predefined amount of flexing has occurred. FIG. 12 illustrates another arrangement of a flexure which can be used as a receptacle, where springs are used to loosely constrain movement in a vertical direction (e.g., to allow overtravel) and tightly constrain movement in a horizontal direction (e.g., for thermocentric averaging).

Figure 13:
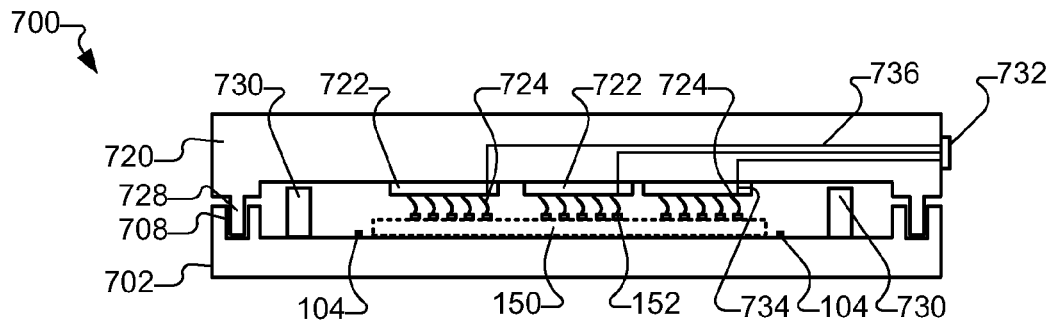
FIG. 13 illustrates another example of a wafer test cassette system with a compression stop according to some embodiments of the invention.

A cassette system can use any one or more of the various alignment elements, such as for example those described in FIGS. 2-12, and combinations and variations thereof. Another example of a cassette system is illustrated in FIG. 13. The cassette system can include a base 702 (which can be like base 102) and a probe card assembly 720 (which can be like probe card assembly 120). The probe card assembly can include one or more substrates 722 on which a plurality of probes 724 are mounted. For example, three substrates 722 are illustrated, although the number of substrates can be more or less. The substrates 722 can be like the substrate 122 described above and the probes 724 can be like the probes 124 described above.

First alignment elements 728 on the probe card assembly 720 can be arranged to align with second alignment elements 708 on the base 702, thereby constraining movement of the probe card assembly relative to the base. For example, as described above, the alignment elements 708, 728 can cooperate to allow vertical movement of the probe card assembly relative to the base while limiting horizontal movement. The alignment elements 708, 728 can be like any of the alignment elements 108, 128, 208, 228, 302, 408, 428, 604, 606, 652, and 654 described above. The cassette system 700 can include fiducials 104.

The cassette system 700 can include one or more compression stops 730. The compression stop can define a limit for vertical movement of the probe card assembly 720 relative to the base 702. For example, the compression stop can have a height selected such that, when the probe card assembly 720 and base 702 are pressed together, a predefined amount of overtravel is produced. In other words, the height of the compression stop can be selected so that the probes 724 undergo a predefined amount of compression when making contact with the terminals 152 of the wafer 150 for a particular predefined thickness of the wafer.

The compression stops 730 can be attached to either the base 702 or to the probe card assembly 720. The compression stops can have a fixed height, or can be adjustable. For example, the compression stops can comprise a screw assembly that allows for the height of the compression stop to be adjusted upwards or downwards. An adjustable compression stop can be helpful, for example, when the cassette system is to be used with different thickness wafers. For example, the compression stop can be adjusted to provide the desired amount of overtravel as a function of the wafer thickness. In some embodiments, a compression stop height can be set equal to the sum of the probe height plus the wafer thickness, minus a desired amount of overtravel.

Electrical connections between the probes 724 and an electrical interface 732 can be provided by electrical connections within the probe card assembly. For example, electrical traces 734 can be provided on or within the substrates 722. The electrical traces 734 can electrically connect to electrical paths 736 provided on or within the probe card assembly 720 and electrically connected to the electrical interface 732.

Figure 14:
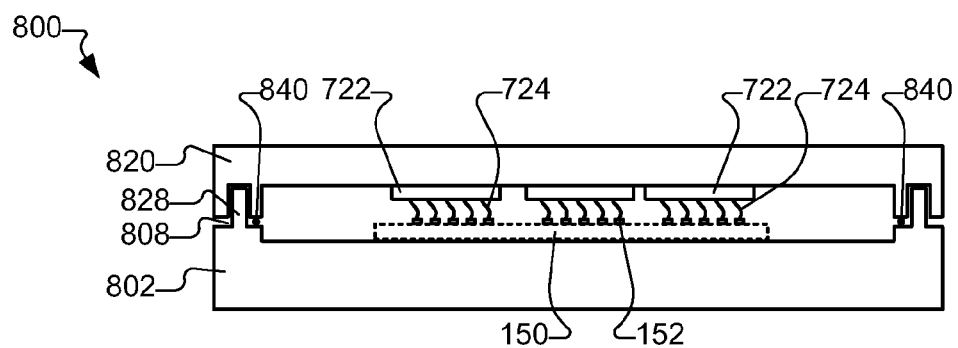
FIG. 14 illustrates another example of a wafer test cassette system with a vacuum seal according to some embodiments of the invention.

Another embodiment of a wafer test cassette system is illustrated in FIG. 14. The cassette system 800 can include a base 802 (which can be like base 702) and a probe card assembly 820 (which can be like probe card assembly 720). Alignment elements 808 and 828 can provide for constrained movement and alignment in a similar manner as described above for alignment elements 708, 720 (e.g., the alignment elements can be like any of alignment elements 108, 128, 208, 228, 302, 408, 428, 604, 652, and 654 described above). The cassette system 800 can include fiducials like fiducials 104 described above. The cassette system 800 can include electrical connections like 732, 734, 736 described above. The cassette system 800 can include compression stops like compression stop 730 disposed on either the base 802 or the probe card assembly 820.

The cassette system 800 can include a vacuum seal 840. The vacuum seal can be disposed in a position to seal space between the base 802 and the probe card assembly 820. Creating vacuum between the base and the probe card assembly can help to compensate for bending forces places onto the probe card assembly by the probes 724. For example, overtravel of the probe card assembly 820 relative to the base 802 places compressive forces onto the probes 724. The compressive forces result in a reactive force against the probe card assembly 820 which tends to bow the substrate(s) 722 and/or body of the probe card assembly 820 upward. The vacuum can create a counteracting force that tends to cancel out some or substantially all of the reactive force.

The vacuum seal 840 can take on various forms, including for example, an o ring, a gasket, a lip seal, and the like. If desired, the vacuum seal can be separate and distinct from the base 802 and probe card assembly 820, or the vacuum seal can be attached to one or the other of the base 802 or the probe card assembly 820.

Figure 15:
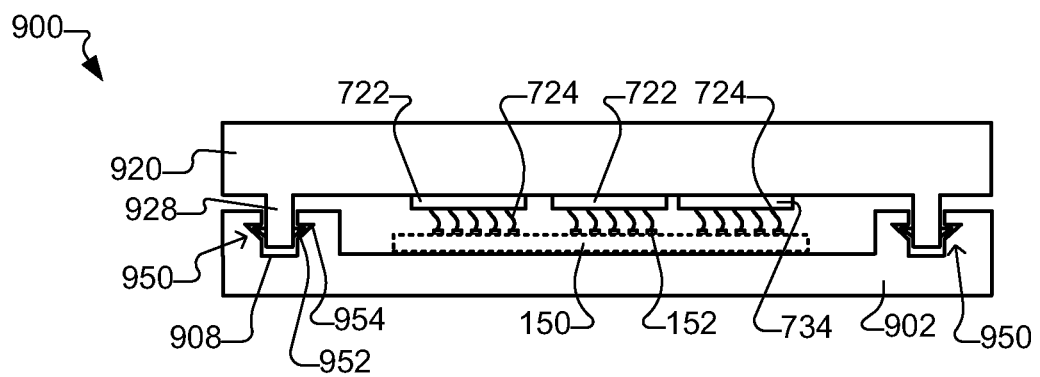
FIG. 15 illustrates another example of a wafer test cassette system with a locking element according to some embodiments of the invention.

Another embodiment of a wafer test cassette system is illustrated in FIG. 15. The cassette system 900 can include a base 902 (which can be like base 702) and probe card assembly 920 (which can be like probe card assembly 920). Alignment elements 908 and 928 can provide for constrained movement and alignment in a similar manner as described above for alignment elements 708, 720 (e.g., the alignment elements can be like any of alignment elements 108, 128, 208, 228, 302, 408, 428, 604, 652, and 654 described above). The cassette system 900 can include fiducials like fiducials 104 described above. The cassette system 900 can include electrical connections like 732, 734, 736 described above. The cassette system 900 can include compression stops like compression stop 730 disposed on either the base 902 or the probe card assembly 920.

The cassette system 900 can include a locking mechanism 950. The locking mechanism 950 can be disposed in a position to allow locking the base 902 and the probe card assembly 920 together. Various types of locking mechanisms can be used including, for example, screws, pins, latches, and the like. The locking mechanism can be integrated into the alignment elements 808, 820 if desired. For example, the locking mechanism can include retractable pins 952 disposed on the first alignment element 908 which interface into slots 954 disposed on the second alignment element 928. Actuation of the pins 952 can be mechanically or electronically initiated. Alternatively, the locking mechanism 950 can be separate from the alignment elements, for example, disposed on the base and probe card assembly. As another example, the locking mechanism 950 can include a screw which passes through a clearance hole (not shown) disposed in one of the base 902 and the probe card assembly 920 and threads into a threaded hole (not shown) disposed in the other of the base 902 and the probe card assembly 920. Locking the base 902 and the probe card assembly 920 together can be helpful during transportation of the cassette 900 (e.g., a loaded cassette which has a wafer inserted inside).

Figure 16:
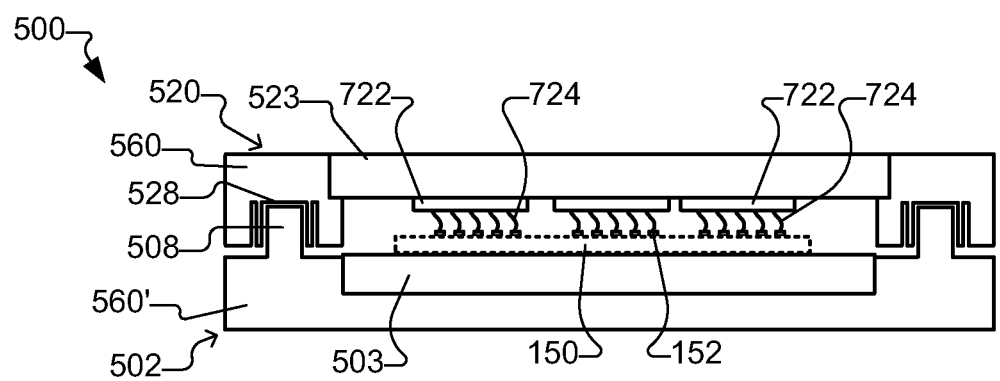
FIG. 16 illustrates another example of a wafer test cassette system with an intermediate element according to some embodiments of the invention.

Another embodiment of a wafer test cassette system is illustrated in FIG. 16. The cassette system 500 can include a base 502 (which can be like base 702) and probe card assembly 520 (which can be like probe card assembly 720). Alignment elements 508 and 528 can provide for constrained movement and alignment in a similar manner as described above for alignment elements 708, 720 (e.g., the alignment elements can be like any of alignment elements 108, 128, 208, 228, 302, 408, 428, 604, 652, 654, 708, 728, 808, and 828 described above). The cassette system 500 can also include any one or more of: fiducials (e.g. like fiducials 104), electrical connections (e.g., like 732, 734, 736), compression stops (e.g., like 730), a vacuum seal (e.g., like vacuum seal 840), and a locking mechanism (e.g., like locking mechanism 940).

The cassette system 500 can include one or more intermediate assemblies 560, 560'. The intermediate assembly 560 can include one or more of the alignment elements 508, 528, and thus can be part of the base 502 or the probe card assembly 520. For example, an intermediate assembly 560 in the form of a ring can be attached to substrate 523 to which probes 724 are coupled, thus forming the probe card assembly 520. As another example, an intermediate assembly 560' can be attached to a substrate 503 capable of receiving a wafer, thus forming the base 502. The base 502 and probe card assembly 560 can each include one or more intermediate assemblies 560, 560'.

Figure 17:
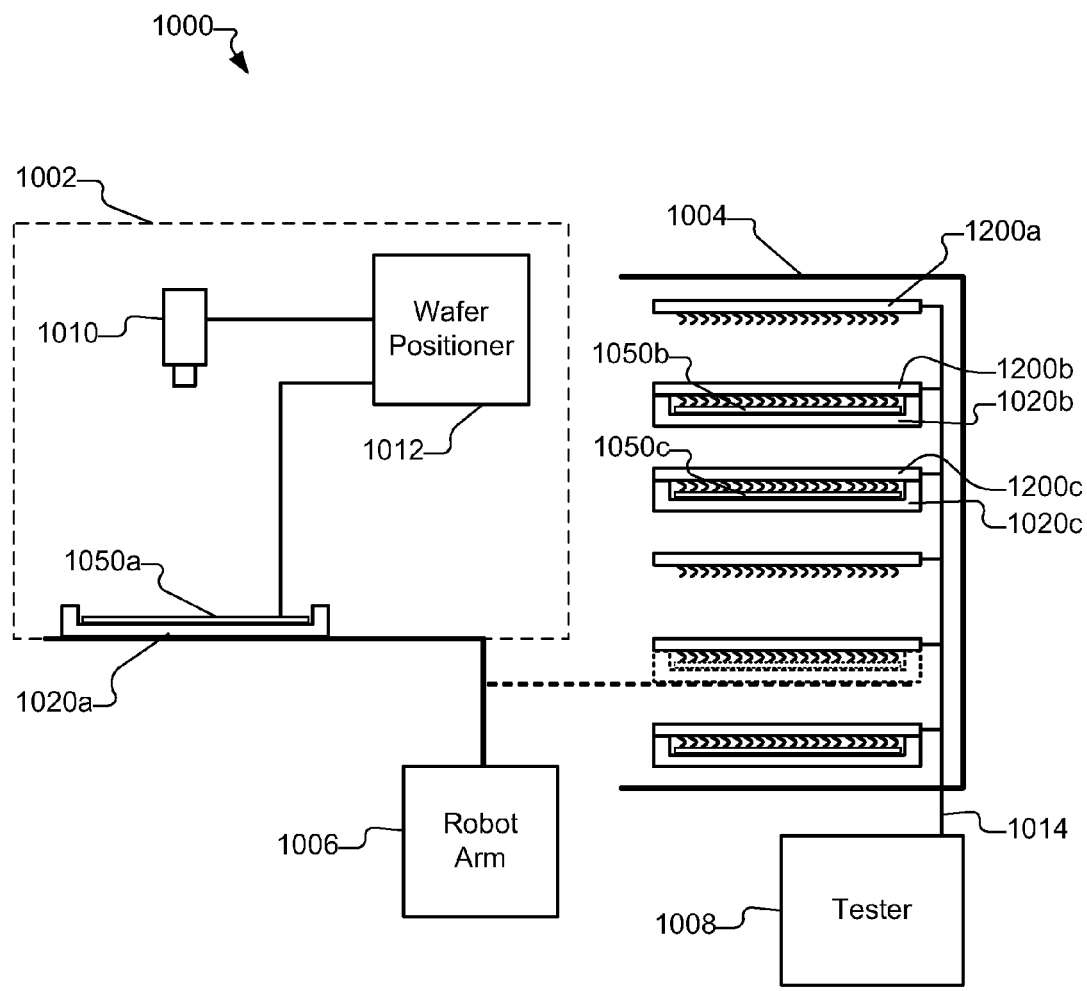
FIG. 17 illustrates a schematic of a wafer testing system according to some embodiments of the invention.

Wafer test cassette systems, for example as described above, can be used in a testing system as will now be illustrated. FIG. 17 illustrates a schematic illustration of a wafer testing system. The wafer testing system 1000 can include a wafer loading subsystem 1002 and a wafer testing rack 1004.

The wafer loading subsystem 1002 can load wafers 1050a, 1050b, 1050c onto bases (e.g. bases 1020a, 1020b, and 1020c). The bases can be like any of bases 102, 202, 402, 502, 702, 802, and 902. Wafers can be positioned onto a surface of the bases and aligned to fiducials on the base. For example, an optical alignment system including a camera 1010, can be used for positioning the wafers using a wafer positioned 1012.

Wafers can be held onto the bases in various ways. For example, the base can include a receiving surface that is sticky so that the wafer tends to stay in position. Alternatively the wafer can be held in position by applying an electrostatic force or vacuum.

The wafer testing rack 1004 can include multiple probe card assemblies 1200a, 1200b, and 1200c. The probe card assemblies 1200a, 1200b, 1200c can be like any of probe card assemblies 120, 220, 520, 720, 820 and 920. The probe card assemblies 1200a, 1200b, 1200c can be mounted into the wafer testing rack 1004 via an intermediate assembly (not shown) to allow for easy installation and removal of the probe card assemblies 1200a, 1200b, 1200c from the wafer testing rack 1004 for maintenance or change over.

After a wafer 1050a, 1050b, 1050c is loaded onto a corresponding base 1020a, 1020b, 1020c, the base can be moved by robot arm 1006 into the wafer testing rack 1004 (e.g. the robot arm position shown in dotted line. Each base can be positioned near a corresponding one of the probe card assemblies, so that alignment elements on the base engage with alignment elements on the probe card assembly. (Bases and probe card assemblies can include alignment elements (not shown) such as alignment elements 108, 128, 208, 228, 302, 408, 428, 508, 528, 604, 606, 652, 654, 708, 728, 808, 828, 908, and 928 described above.) Each base can then be translated vertically (e.g., using the robot arm 1006 or some other positioning mechanism (not shown) disposed in the testing rack 1004) to bring the probes into contact with corresponding ones of the terminals of the wafer. Accordingly, electrical contacts can be made between corresponding ones of the probes and terminals on the wafer. Vertical movement can include overtravel, and can be limited by a compression stop, for example as described above.

Because the wafers 1050a, 1050b, 1050c are positioned onto the bases 1002a, 1002b, 1002c in a predefined position relative to a fiducial disposed on the base, the wafers can be in a predefined position relative to the alignment elements on the base. When the base is interlocked into the corresponding alignment elements on the probe card assembly, this can automatically align the probes to the terminals of the wafer. If desired, a vacuum can be created in the space between the base and the corresponding probe card assembling using a vacuum system (not shown). For example, the vacuum system can connect to ports on the probe card assembly or base.

The probe card assemblies 1200a, 1200b, 1200c can be electrically connected to a tester 1008. The probe card assemblies can include connectors or wires (not shown) to make electrical connections to a communications link or cable 1014 to the tester 1008. For example, the probes can be electrically connected via any of traces and/or vias in the probe card assembly, interposer assemblies, flexible cables, connectors, and/or wireless links to allow communication of electrical signals to and from the probes. Because the probe card assemblies 1200a, 1200b, 1200c are held in the testing rack 1004, they can have fixed connections to a tester 1008 if desired. The probe card assemblies can include electronics (e.g., test chips, buffers, test controllers, switches, and the like) to augment or replace the testing performed by the tester 1008.

Once the probes have been brought into contact with the terminals, testing of the wafers can be performed. Multiple wafers can be loaded into the test rack 1004, hence testing of multiple wafers can occur simultaneously. For example, a first wafer can be loaded, and testing of the first wafer can proceed while a second wafer is being loaded. Testing can include, for example, functional testing, burn-in testing, and other types of tests. While some wafers in the testing rack 1004 are being tested, other wafers can be in the process of being loaded or unloaded into the testing rack using the wafer loading subsystem 1002.

If desired, the testing rack 1004 can be held at an elevated temperature by an environmental control system (not shown). For example, elevated temperatures are frequently used during burn in testing. The bases 1020a, 1020b, 1020c and loaded wafers 1050a, 1050b, 1050c can thus be preheated using a heater (not shown) in the positioning subsystem 1002 to bring their temperature close to that of the testing rack 1004 before being moved into position in the testing rack. Alternatively, the bases can be heated in the testing rack 1004 before the probes are brought into contact with the terminals of the wafer. Alternatively to heating the testing rack 1004 and bases 1020a, 1020b, 1020c, cooling can be employed using a cooling device (not shown) in the positioning subsystem 1002. Thus, changing the temperature of the base and the wafer can be performed before coupling the bases to the corresponding probe card assemblies.

The bases 1004a, 1004b, 1004c can have a relatively small thermal mass as compared to the probe card assemblies 1200a, 1200b, 1200c. Thus, the bases and wafers can be heated (or cooled) relatively quickly, helping to reduce overall test time (as compared with a system that heats up and cools down the probe card assembly). Moreover, using thermocentric slots can help to avoid the need to closely match the wafer (and base) temperature to the probe card assembly temperature before bringing the wafer into contact with the probe card assembly.

If desired, the bases 1020a, 1020b, 1020c (and wafers 1050a, 1050b, 1050c) can be heated or cooled to a first temperature which is different than a second temperature at which the testing rack 1004 is held. For example, the first temperature and the second temperature can be selected so that a thermal strain of the wafer at the first temperature matches a thermal strain of the probe card assembly at the second temperature. This can help to minimize alignment errors caused by temperature-induced dimensional changes in the base, wafer, and probe card assembly.

If adjustable height compression stops are included on the base, the height of the compression stops can be adjusted before or during the loading of the wafer onto the base based on a nominal height of the wafer. That can help to ensure that a predefined amount of overtravel is produced during the vertical translation of the base onto the probe card assembly.

Although specific embodiments and applications of the invention have been described in this specification, these embodiments and applications are exemplary only, and many variations are possible. Accordingly, there is no intention that the invention be limited these exemplary embodiments and applications or to the manner in which the exemplary embodiments and applications operate or are described herein. For example, features shown in one embodiment can be combined with features shown in another embodiment. Spring contacts illustrated herein can be made using processes different from those described, and the processes described herein can be used to make different types of spring contacts than those illustrated. Accordingly, it is not intended that the invention be limited except as by the claims set forth below.

We claim:

1. A wafer cassette system for holding a wafer comprising:
   a base comprising a fiducial, a receiving surface sized to receive said wafer, and a plurality of first alignment elements;
   a probe card assembly comprising a substrate, a plurality of probes arranged to contact terminals of said wafer, and a plurality of second alignment elements corresponding to said first alignment elements; and
   wherein said first alignment elements and said second alignment elements comprise complementary shapes capable of interlocking,
   wherein while interlocked, each pair of one of said first alignment elements interlocked with one of said second alignment elements constrains movement of one of said base or said probe card assembly relative to the other of said base or said probe card assembly in at least a first direction that is substantially parallel to said receiving surface while permitting relative movement of said one of said base or said probe card assembly relative to the other of said base or said probe card assembly in a direction substantially perpendicular to said receiving surface, and
   wherein while interlocked, each said pair of one of said first alignment elements interlocked with one of said second alignment elements permits movement of said one of said base or said probe card assembly relative to the other of said base or said probe card assembly in a second direction that is substantially perpendicular to said first direction and substantially parallel to said receiving surface.

2. The system of claim 1, further comprising a vacuum seal disposed to seal space between said base and said probe card assembly.

3. The system of claim 1, wherein one of said base and said probe card assembly comprises a compression stop disposed to define a limit to relative movement of said base and said probe card assembly toward each other.

4. The system of claim 3, wherein said compression stop has an adjustable height.

5. The system of claim 1, wherein one of said first alignment element and said second alignment element comprises a protrusion, and another of said first alignment element and said second alignment element comprises a thermocentric slot.

6. The system of claim 1, wherein the first alignment element and the second alignment element comprise a kinematic coupling in series with a motion guidance mechanism.

7. The system of claim 6, wherein the motion guidance mechanism comprises a flexure.

8. The system of claim 1, wherein one of said first alignment element and said second alignment element comprises a protrusion, and another of said first alignment element and said second alignment element comprises a flexure.

9. The system of claim 1, further comprising a latching mechanism disposed to enable locking said base and said probe card assembly together.

10. The system of claim 1, wherein said first alignment elements and said second alignment elements provide a wiping motion of said probes relative to said terminals.

* * * * *